(12) United States Patent
Lee

(10) Patent No.: US 6,418,025 B1
(45) Date of Patent: Jul. 9, 2002

(54) CLIP FOR HEAT SINK

(75) Inventor: Chao Yang Lee, Taipei (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/613,878

(22) Filed: Jul. 10, 2000

(30) Foreign Application Priority Data

Apr. 14, 2000 (TW) ........................................ 89206077 U

(51) Int. Cl.[7] ................................................ H05K 7/20
(52) U.S. Cl. ........................ 361/719; 24/458; 248/510
(58) Field of Search .......................... 24/457, 458, 625; 174/16.3; 165/80.3, 185; 267/150, 158, 160; 248/316.7, 500, 509, 510; 257/706, 707, 713, 718, 719, 727; 361/703, 704, 717–719

(56) References Cited

U.S. PATENT DOCUMENTS

| | | | | |
|---|---|---|---|---|
| 3,909,883 A | * | 10/1975 | Fegen | 174/138 D |
| 4,710,852 A | * | 12/1987 | Keen | 361/717 |
| 5,818,695 A | * | 10/1998 | Olson | 361/719 |

* cited by examiner

Primary Examiner—Gerald Tolin
(74) Attorney, Agent, or Firm—Wei Te Chung

(57) ABSTRACT

A clip (10) for attaching a heat sink to an electronic device mounted on a circuit board includes a body (17) and a handle (15) extending from the body for facilitating operation of the clip. An arcuate spring tab (12) extends from the body and elastically engages with the heat sink. A pair of cutouts (16) is defined in opposite edges of the body for accommodating thickness of the circuit board. A pair of elastically deformable barbs (14) is formed at a distal end of the body for engaging with the circuit board to securely fix the heat sink to the circuit board.

1 Claim, 4 Drawing Sheets

US 6,418,025 B1

CLIP FOR HEAT SINK

BACKGROUND

1. Field of the Invention

The present invention relates to a clip, and particularly to a clip for readily attaching a heat sink to an electronic device.

2. The Related Art

A heat sink is usually placed in contact with an electronic device package for dissipating heat from the electronic device package. Various clips have been used to attach a heat sink to an electronic device package.

FIG. 5 shows a conventional clip assembly 59 which attaches a heat sink 52 to a chipset 54 for dissipating heat from the chipset 54. A pair of fixing holes 51 is formed in a motherboard 50 to which the chipset 54 is mounted. A heat sink 52 comprises a rectangular chassis 57 positioned on the chipset 54 and two fastening ears 58 each defining a fastening hole 53 extending from the rectangular chassis 57. A clip assembly 59 is associated with each fastening ear 58 for securing the heat sink 52 to the motherboard 50. The clip assembly 59 comprises a pin 56 having a tapered insertion end and a spring 55 fit over and encompassing the pin 56. The insertion end of the pin 56 extends through the fastening hole 53 of the corresponding fastening ear 58 and engages with the corresponding fixing hole 51 of the motherboard 50. However, this arrangement requires four parts, namely, two pins and two springs, to secure the heat sink 52 to the chipset 54, which is costly and complicates the assembly process.

SUMMARY OF THE INVENTION

Accordingly, an object of the present invention is to provide a clip for a heat sink which has a simple configuration.

Another object of the present invention is to provide a clip for a heat sink which readily attaches the heat sink to an electronic device.

To achieve the above-mentioned objects, a clip in accordance with the present invention for attaching a heat sink to an electronic device mounted on a circuit board includes a body and a handle extending from the body for facilitating operation of the clip. An arcuate spring tab extends from the body and elastically engages with the heat sink. A pair of cutouts is defined in opposite edges of the body for accommodating a thickness of the circuit board. A pair of elastically deformable barbs is formed at a distal end of the body for engaging with the circuit board to securely affix the heat sink thereto.

Other objects, advantages and novel features of the present invention will be drawn from the following detailed embodiment of the present invention with attached drawings, in which:

DESCRIPTION OF THE PREFERRED EMBODIMENTS

Figure 1:
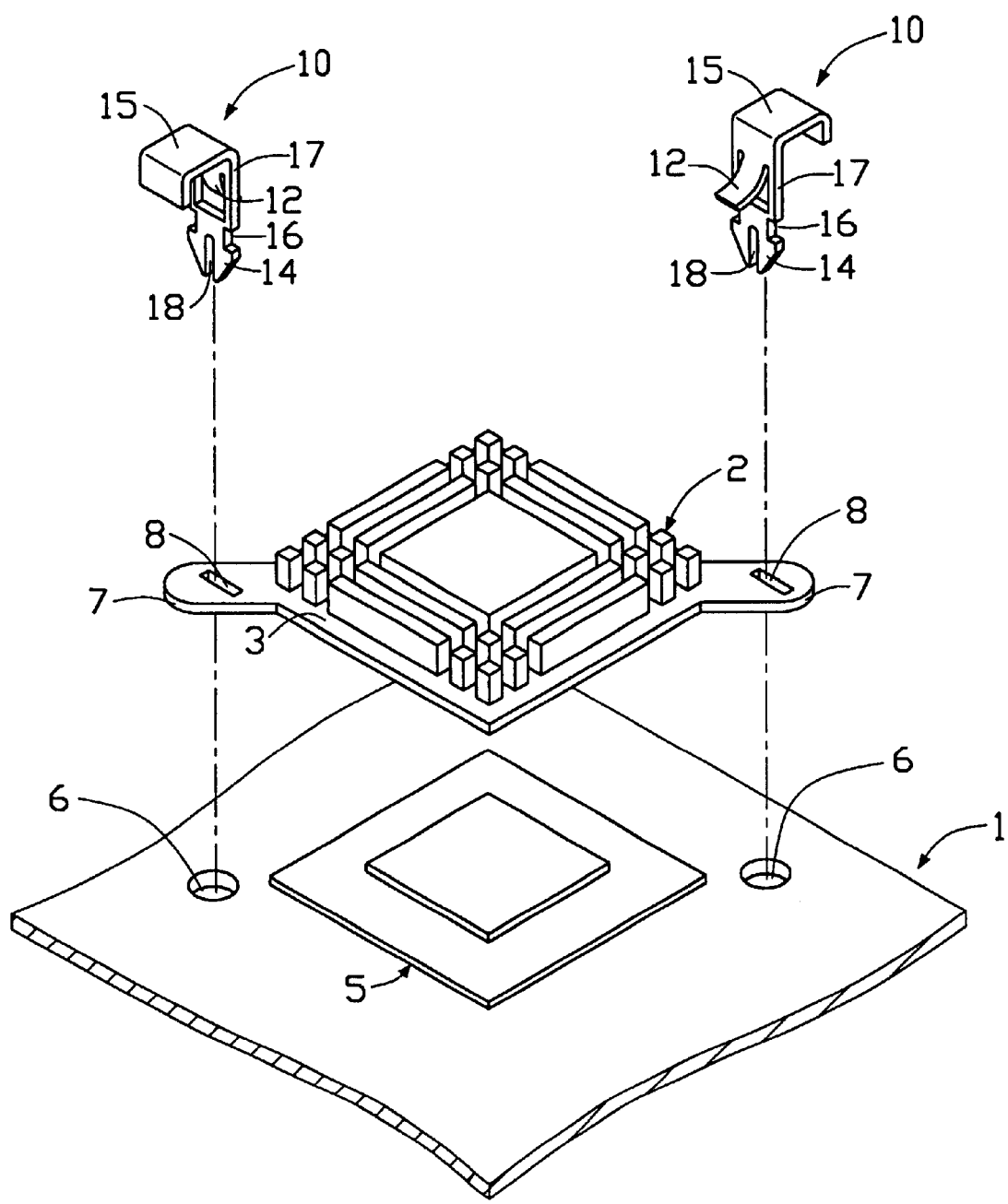
FIG. 1 is an exploded view showing a pair of clips constructed in accordance with a first embodiment of the present invention attaching a heat sink to an electronic device mounted on a circuit board.
Figure 2:
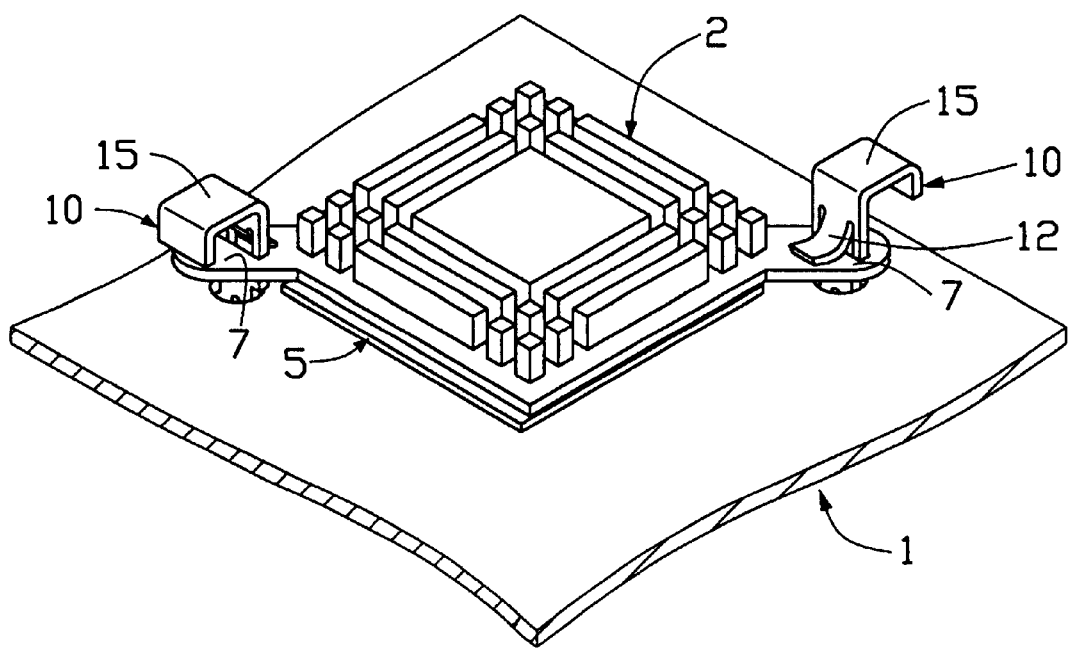
FIG. 2 is an assembled view of the FIG. 1.

Referring to FIGS. 1 and 2, a pair of clips 10 of the present invention is used to attach a heat sink 2 to an electronic device 5 mounted on a printed circuit board (PCB) 1. A pair of fixing holes 6 is defined in the PCB 1 with the electronic device 5 positioned between the fixing holes 6. The heat sink 2 comprises a chassis 3 with a pair of fastening ears 7 extending therefrom in diagonally opposite directions. Each fastening ear 7 forms a rectangular fastening hole 8 corresponding to the fixing holes 6 of the PCB 1 for extension of the clips 10 therethrough.

Each clip 10 is stamped from a metal sheet and comprises a body 17 and a handle 15 substantially perpendicularly extending from the body 17. A spring tab 12 extends from the body 17 in a direction opposite the handle 15. A pair of cutouts 16 is defined in opposite edges of the body 17. The body 17 forms a tapered distal end (not labelled) and has a slot 18 extending in a longitudinal direction through the distal end, forming a pair of barbs 14 at the distal end of the body 17. Width of each cutout 16 is substantially equal to thickness of the PCB 1. The slot 18 defined between the barbs 14 allows elastic deformation of the barbs 14.

The heat sink 2 is mounted to the electronic device 5 by the clips 10 extending through the fastening holes 8 of the heat sink 2 and engaging with the PCB 1. The barbs 14 of the clips 10 extend through the fixing holes 6 of the PCB 1 with edges of the holes 6 in the PCB 1 being received in the cutouts 16. The spring tab 12 of the clip 10 is deformed by its engagement with the corresponding fastening ear 7 of the heat sink 2, and therefore provides a spring force for securely fixing the heat sink 2 to the electronic device 5. Thus, the clip 10 readily attaches the heat sink 2 to the electronic device 5.

Figure 3:
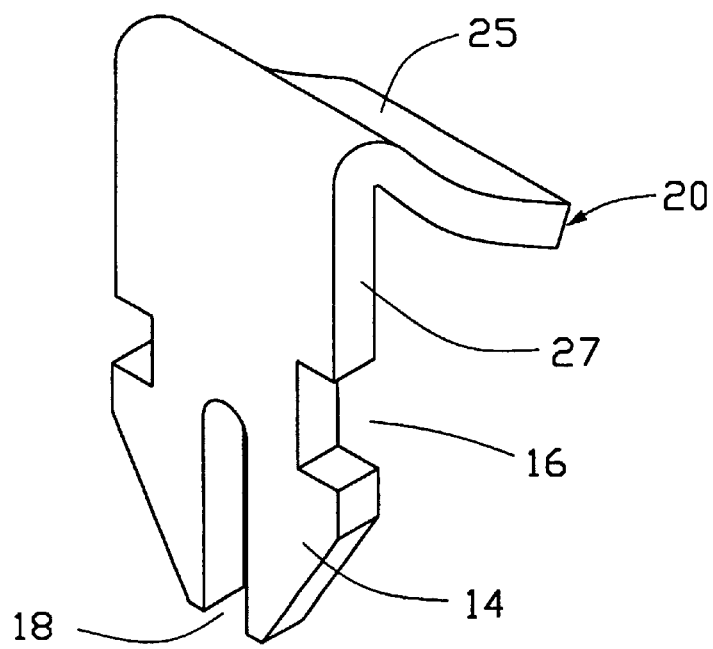
FIG. 3 is a perspective view of a clip constructed in accordance with a second embodiment of the present invention.

Also referring to FIG. 3, a clip 20 in accordance with a second embodiment of the present invention is shown. A handle 25 substantially transversely extends from a body 27 of the clip 20. Similar to the first embodiment of the present invention as shown in FIGS. 1 and 2, the clip 20 forms a pair of cutouts 16, a pair of barbs 14 and a slot 18 rendering the barbs 14 elastically deformable. The barbs 14 extend through fastening holes 8 of the heat sink 2 and engage with the PCB 1. The handle 25 is deformed by contact with a corresponding fastening ear 7 of the heat sink 2, and thereby provides a spring force to securely fix the heat sink 2 to the electronic device 5.

Figure 4:
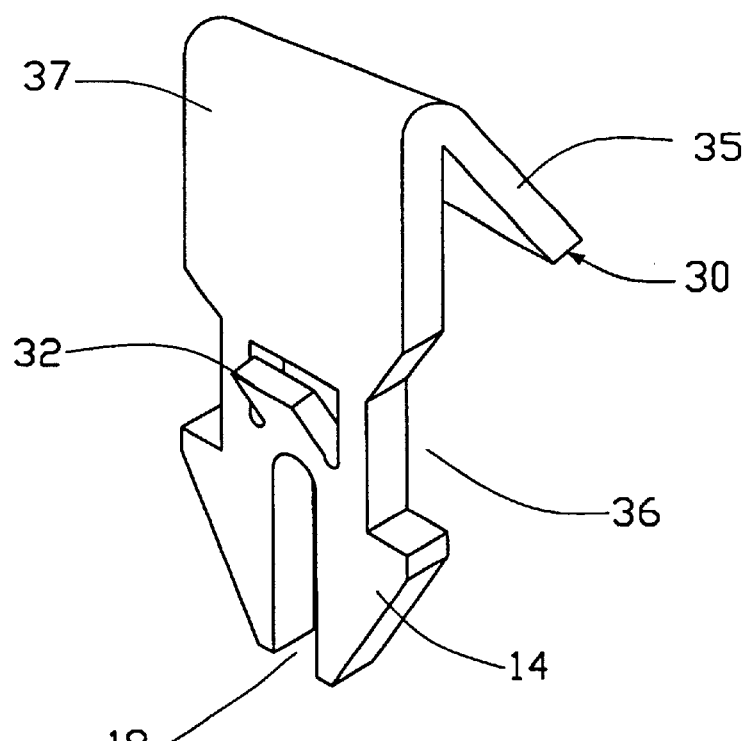
FIG. 4 is a perspective view of a clip constructed in accordance with a third embodiment of the present invention.
Figure 5:
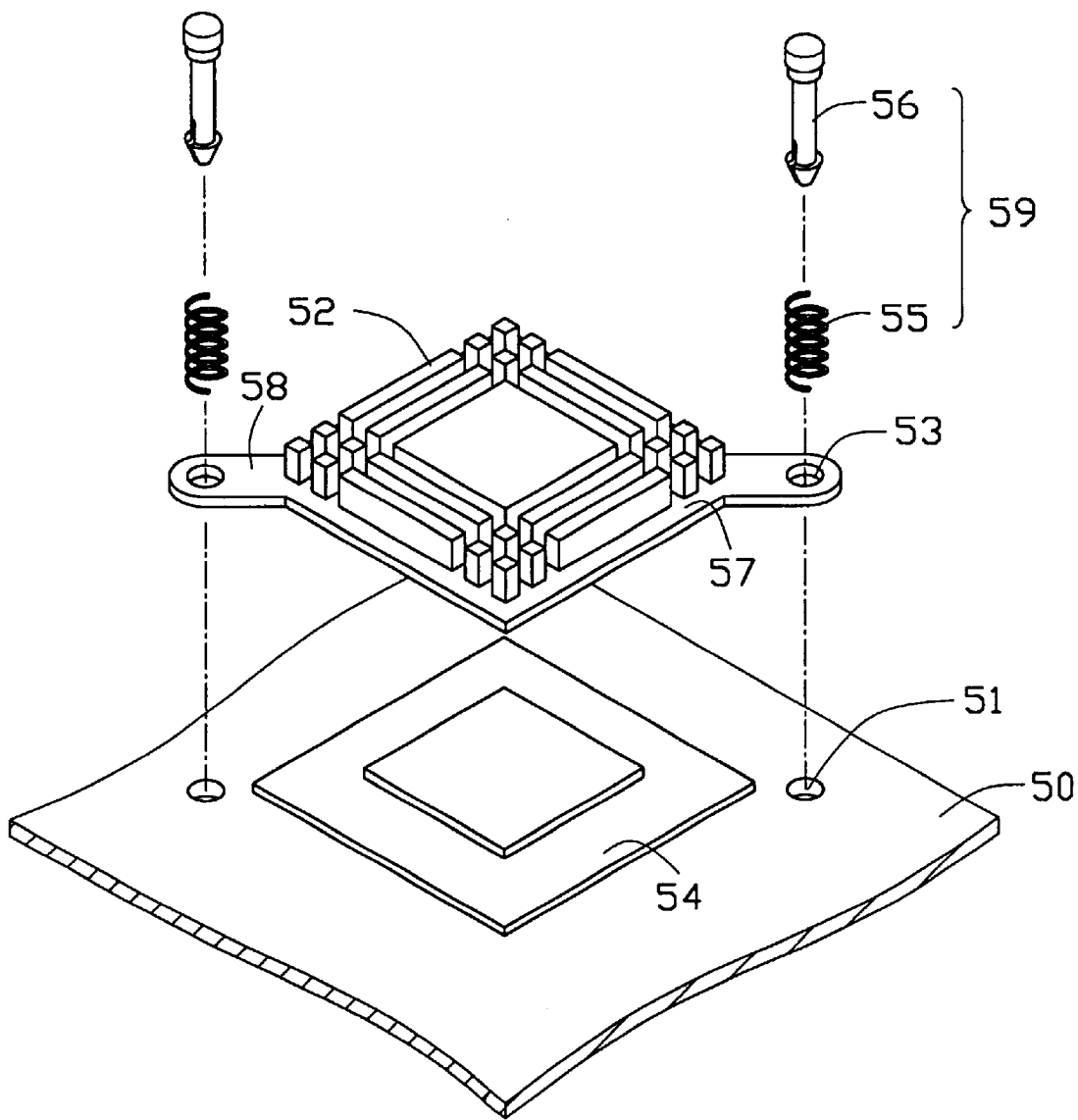
FIG. 5 is an exploded view showing a pair of conventional clips attaching a heat sink to an electronic device mounted on a circuit board.

Referring to FIG. 4, a clip 30 in accordance with a third embodiment of the present invention is shown. The clip 30 comprises a body 37 for engaging with a PCB 1 and a handle 35 extending from the body 37 for elastically abutting against the heat sink 2. The body 37 defines a pair of notches 36 in opposite edges thereof for accommodating thickness of the PCB 1 and forms a pair of barbs 14 with a slot 18 defined therebetween at a distal end thereof. A tab 32 is stamped on the body 37 between the notches 36 and extends in a direction opposite to that of the handle 35. The barbs 14 extend through a fastening hole 8 of the heat sink 2 and a fixing hole 6 of the PCB 1. The handle 35 contacts and is thus deformed by a top surface of a fastening ear 7 of the heat sink 2, providing a spring force to securely fix the heat sink 2 to the electronic device 5. The tab 32 of the clip 30 engages a bottom surface of the fastening ear 7 to prevent the clip 30 from being unexpectedly separated from the PCB 1, especially when the handle 35 generates a large spring force.

The above description of the preferred embodiments is to illustrate the present invention, not to limit the scope of the present invention. Any changes or modifications that do not depart from the spirit of the present invention should be covered in the scope of the present invention as defined in the appended claims.

What is claimed is:

1. A heat sink assembly comprising:

a printed circuit board with an electronic device thereon and at least a round fixing hole therein beside said electronic device;

a heat sink positioned on said electronic device and including at least one fastening ear with therein a linear slit-like fastening hole in alignment with said fixing hole; and a clip including an elongated body with a cross-section in compliance with said linear slit-like fastening hole, said clip further including around a lower portion of the body deformable barbs extending through both said linear slit-like fastening hole and said round fixing hole and latchably upwardly engaged with the printed circuit board, and a spring tab integrally extending from an upper portion of the body and downwardly engaged with the fastening ear, said barbs having a longitudinal slit therebetween extending only below the spring tab.

\* \* \* \* \*